(12) United States Patent
Liu et al.

(10) Patent No.: US 12,520,694 B2
(45) Date of Patent: Jan. 6, 2026

(54) DISPLAY PANEL INCLUDING LIGHT EMITTING DEVICE GROUPS, LIGHT EXITING PART GROUPS AND OPTICAL STRUCTURE UNITS, AND DISPLAY APPARATUS

(71) Applicants: Beijing BOE Display Technology Co., Ltd., Beijing (CN); BOE Technology Group Co., Ltd., Beijing (CN)

(72) Inventors: Yujie Liu, Beijing (CN); Song Yang, Beijing (CN); Qian Wu, Beijing (CN); Zheng Fang, Beijing (CN); Ge Shi, Beijing (CN); Yanliu Sun, Beijing (CN); Jiahui Han, Beijing (CN); Pengxia Liang, Beijing (CN); Hongpeng Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 779 days.

(21) Appl. No.: 17/795,354

(22) PCT Filed: Sep. 29, 2021

(86) PCT No.: PCT/CN2021/121584
§ 371 (c)(1),
(2) Date: Jul. 26, 2022

(87) PCT Pub. No.: WO2023/050122
PCT Pub. Date: Apr. 6, 2023

(65) Prior Publication Data
US 2024/0188367 A1    Jun. 6, 2024

(51) Int. Cl.
*H10K 59/38* (2023.01)
*H10K 59/122* (2023.01)
*H10K 59/80* (2023.01)

(52) U.S. Cl.
CPC ........... *H10K 59/38* (2023.02); *H10K 59/122* (2023.02); *H10K 59/879* (2023.02)

(58) Field of Classification Search
None
See application file for complete search history.

(56) References Cited

U.S. PATENT DOCUMENTS

| | | | | |
|---|---|---|---|---|
| 2015/0048333 A1* | 2/2015 | Choi | ............... | H10K 59/879 257/40 |
| 2019/0371866 A1* | 12/2019 | Kim | ............... | H10K 59/879 |

(Continued)

*Primary Examiner* — Nduka E Ojeh
(74) *Attorney, Agent, or Firm* — Nath, Goldberg & Meyer; Joshua B. Goldberg

(57) ABSTRACT

A display panel and a display apparatus are disclosed. The display panel includes multiple light emitting device groups, multiple light exiting part groups and multiple optical structure units, wherein each light emitting device group includes multiple light emitting devices including first and second light emitting devices, for emitting light of a preset color; each light exiting part groups includes first and second color conversion parts; an orthographic projection of each optical structure unit on the first base substrate covers an orthographic projection of at least one light emitting device group on the first base substrate, each optical structure unit is to direct light emitted by the first and second light emitting devices to the first and second color conversion parts, respectively, the first and second color conversion parts are to convert light of the preset color into light of a first color and light of a second color, respectively.

19 Claims, 8 Drawing Sheets

(56) References Cited

U.S. PATENT DOCUMENTS

2021/0193968 A1\* 6/2021 Lee ................ H10K 59/879
2024/0260326 A1\* 8/2024 Lee ................ H10K 59/122

\* cited by examiner

DISPLAY PANEL INCLUDING LIGHT EMITTING DEVICE GROUPS, LIGHT EXITING PART GROUPS AND OPTICAL STRUCTURE UNITS, AND DISPLAY APPARATUS

This is a National Phase Application filed under 35 U.S.C. 371 as a national stage of PCT/CN2021/121584, filed Sep. 29, 2021, the contents of which are hereby incorporated by reference in its entirety.

TECHNICAL FIELD

The present disclosure relates to the field of display technology, and in particular, to a display panel and a display apparatus.

BACKGROUND

A display architecture combining a quantum dot layer and an Organic Light-Emitting Diode (OLED) can realize a higher color gamut, a higher resolution and a larger viewing angle, and is suitable for a large-size self-luminous display technology.

SUMMARY

The present disclosure provides a display panel and a display apparatus.

In order to achieve the above object, the present disclosure provides a display panel including a plurality of light emitting device groups, a plurality of light exiting part groups and a plurality of optical structure units, wherein the plurality of light emitting device groups are on a first base substrate, each of the plurality of light emitting device groups includes a plurality of light emitting devices, the plurality of light emitting devices include a first light emitting device and a second light emitting device, and the first light emitting device and the second light emitting device each are configured to emit light of a preset color;

the plurality of light exiting part groups are on an emergent side of the light emitting device groups, and each of the plurality of light exiting part groups includes a first color conversion part and a second color conversion part; and the plurality of optical structure units are between the plurality of light emitting device groups and the plurality of light exiting part groups, an orthographic projection of each of the plurality of optical structure units on the first base substrate covers an orthographic projection of at least one of the plurality of light emitting device groups on the first base substrate, each of the plurality of optical structure units is configured to direct light emitted by the first light emitting device to the first color conversion part and direct light emitted by the second light emitting device to the second color conversion part, the first color conversion part is configured to convert the light of the preset color into light of a first color, and the second color conversion part is configured to convert the light of the preset color into light of a second color.

In some embodiments, an orthographic projection of the first light emitting device does not overlap an orthographic projection of the first color conversion part on the first base substrate; and/or an orthographic projection of the second light emitting device does not overlap an orthographic projection of the second color conversion part on the first base substrate.

In some embodiments, the light of the first color is different from the light of the second color in wavelength range.

In some embodiments, the plurality of light emitting devices in the light emitting device group further include a third light emitting device, each of the plurality of light exiting part groups further includes a light transmission part, the orthographic projection of each of the plurality of optical structural units on the first base substrate further covers an orthographic projection of the third light emitting device on the first base substrate, and each of the plurality of optical structure units is further configured to direct light emitted by the third light emitting device to the light transmission part.

In some embodiments, the optical structure unit is a condensing lens, and an equivalent air thickness between an emergent surface of the light emitting device and an emergent surface of the optical structure unit is in a range of one to two times a focal length of the condensing lens.

In some embodiments, the equivalent air thickness between the emergent surface of the optical structure unit and the emergent surface of the light emitting device is greater than or equal to a target thickness, and the target thickness H satisfies the following formula:

$$\frac{f - h1}{H} = \frac{h2 - f}{h2},$$

where h1 is an arc height of the condensing lens, h2 is an equivalent air thickness between the emergent surface of the condensing lens and an incident surface of the light exiting part, and f is a focal length of the condensing lens.

In some embodiments, the light emitting device includes a first electrode and a light emitting layer on a side of the first electrode away from the first base substrate, and the display panel further includes a pixel defining layer on the first base substrate, the pixel defining layer has a plurality of first accommodation grooves, the plurality of light emitting devices in a same light emitting device group are in a same first accommodation groove, different light emitting device groups are in different first accommodation grooves, respectively, and the first electrodes of the plurality of light emitting devices in the same first accommodation groove are spaced apart from each other.

In some embodiments, the display panel further includes:

an encapsulation layer, which is on a side of the plurality of light emitting device groups away from the first base substrate, and is configured to encapsulate the plurality of light emitting device groups;

a first filling layer on a side of the encapsulation layer away from the first base substrate; and a second filling layer between the first filling layer and the plurality of light exiting part groups, wherein the optical structure unit is between the first filling layer and the second filling layer and is in contact with the first filling layer and the second filling layer, and a surface of the optical structure unit close to the second filling layer is a convex curved surface; and a refractive index of the first filling layer and a refractive index of the second filling layer are different from a refractive index of the optical structure unit.

In some embodiments, the display panel further includes a pixel defining layer between the encapsulation layer and the first base substrate, any two light emitting device groups adjacent to each other are separated from each other by the pixel defining layer, the encapsulation layer includes a first encapsulation sub-layer, a second encapsulation sub-layer and a third encapsulation sub-layer, which are sequentially arranged in a direction away from the first base substrate, wherein the plurality of light emitting devices in a same light emitting device group are arranged in a first direction, and a width $W_{PDL}$ of the pixel defining layer between the two light emitting device groups adjacent to each other and arranged in the first direction satisfies:

$$d_1*\sin\theta_1+d_2*\sin\theta_2+d_3*\sin\theta_3+d_4*\sin\theta_4 \leq W_{PDL}/2,$$

where $\theta_1$ is a maximum included angle between light incident into the first encapsulation sub-layer and a thickness direction of the display panel, $\theta_2$ is a maximum included angle between light incident into the second encapsulation sub-layer and the thickness direction of the display panel, $\theta_3$ is a maximum included angle between light incident into the third encapsulation sub-layer and the thickness direction of the display panel, $\theta_4$ is a maximum included angle between light incident into the first filling layer and the thickness direction of the display panel; $d_1$ is a thickness of the first encapsulation sub-layer, $d_2$ is a thickness of the second encapsulation sub-layer, $d_3$ is a thickness of the third encapsulation sub-layer, and $d_4$ is a thickness of the first filling layer.

In some embodiments, the display panel further includes:
a pixel defining layer between the encapsulation layer and the first base substrate, wherein any two light emitting device groups adjacent to each other are spaced apart from each other by the pixel defining layer, and
a light shielding layer between the encapsulation layer and the first filling layer, wherein an orthographic projection of the light shielding layer on the first base substrate is within an orthographic projection of the pixel defining layer on the first base substrate.

In some embodiments, the plurality of light emitting devices in the light emitting device group are sequentially arranged in the first direction, the light shielding layer includes a plurality of first light shielding strips arranged in a first direction, each of the first light shielding strips is arranged in a second direction, and a spacing region between every two light emitting device groups adjacent to each other and arranged in the first direction corresponds to one of the plurality of first light shielding strips.

In some embodiments, the encapsulation layer includes a first encapsulation sub-layer, a second encapsulation sub-layer and a third encapsulation sub-layer, which are sequentially arranged in a direction away from the first base substrate, a width $W_{SL}$ of the first light shielding strip satisfies:

$$W_{SL} \geq W_{PDL}-(d_1\times\sin\theta_1+d_2\times\sin\theta_2+d_3\times\sin\theta_3)\times 2,$$

where $\theta_1$ is a maximum included angle between light incident into the first encapsulation sub-layer and the thickness direction of the display panel, $\theta_2$ is a maximum included angle between light incident into the second encapsulation sub-layer and the thickness direction of the display panel, $\theta_3$ is a maximum included angle between light incident into the third encapsulation sub-layer and the thickness direction of the display panel, $\theta_4$ is a maximum included angle between light incident into the first filling layer and the thickness direction of the display panel; $W_{PDL}$ is a width of the pixel defining layer, $d_1$ is a thickness of the first encapsulation sub-layer, $d_2$ is a thickness of the second encapsulation sub-layer, and $d_3$ is a thickness of the third encapsulation sub-layer.

In some embodiments, the optical structure unit has a refractive index in a range of 1.54 to 2.0.

In some embodiments, an orthographic projection of each of the plurality of light exiting part groups on the first base substrate is within the orthographic projection of the optical structure unit on the first base substrate.

In some embodiments, the light emitting device includes a first electrode, a second electrode and a light emitting layer, wherein the first electrode is on a side of the light emitting layer close to the first base substrate, the second electrode is on a side of the light emitting layer away from the first base substrate, the first electrode is a reflective electrode, the second electrode is a transflective electrode, a microcavity structure is formed between the first electrode and the second electrode, and the microcavity structure is configured to adjust an intensity of emergent light of the light emitting device, so that an intensity of emergent light with an emergent angle exceeding 50° is less than an intensity of emergent light with an emergent angle in a range of 0° to 30°.

In some embodiments, the light emitting device further includes a hole injection layer, a hole transport layer, an electron injection layer, and an electron transport layer, the hole injection layer is between the first electrode and the light emitting layer, the hole transport layer is between the hole injection layer and the light emitting layer, the electron transport layer is between the light emitting layer and the second electrode, the electron injection layer is between the electron transport layer and the electron injection layer, and
a thickness of the first electrode is in a range of 90 nm to 110 nm;
a thickness of the hole injection layer is in a range of 70 nm to 80 nm;
a thickness of the hole transport layer is in a range of 40 nm to 50 nm;
a thickness of the light emitting layer is in a range of 45 nm to 55 nm;
a thickness of the electron transport layer is in a range of 190 nm to 210 nm;
a thickness of the electron injection layer is in a range of 210 nm to 230 nm; and
a thickness of the second electrode is in a range of 20 nm to 30 nm.

In some embodiments, the display panel further includes an accommodation structure having a plurality of second accommodation grooves, each of the first color conversion parts and the second color conversion parts is in one of the plurality of second accommodation grooves, different first color conversion parts are in different ones of the plurality of second accommodation grooves, respectively, different second color conversion parts are in different ones of the plurality of second accommodation grooves, respectively, and the first color conversion part and the second color conversion part are in different ones of the second accommodation grooves, respectively.

In some embodiments, the display panel further includes:
a color filter layer on a side of the plurality of light exiting part groups away from the first base substrate, wherein the color filter layer includes a plurality of first color filter parts and a plurality of second color filter parts, the first color filter parts correspond to the first color conversion parts in a one-to-one correspondence, the second color filter parts correspond to the second color conversion parts in a one-to-one correspondence, the first color filter part is configured to allow the light of the first color to pass through, and the second color filter part is configured to allow the light of the second color to pass through;

a black matrix on a side of the plurality of light exiting part groups away from the first base substrate, wherein an orthographic projection of at least a part of each of the first color conversion parts on the first base substrate, an orthographic projection of at least a part of each of the second color conversion parts on the first base substrate, and an orthographic projection of the black matrix on the base substrate do not overlap; and a second base substrate on a side of the color filter layer away from the first base substrate.

In some embodiments, the optical structure unit is a condensing lens.

In some embodiments, the plurality of light emitting devices in a same light emitting device group are arranged in a first direction, the condensing lens is a lenticular lens, and an axis of the lenticular lens extends in a second direction which intersects the first direction; and the light of the first color is red light, and an orthographic projection of a corresponding axis of the condensing lens on the first base substrate passes through an orthographic projection of the first color conversion part on the first base substrate.

In some embodiments, a material of each of the first color conversion part and the second color conversion part includes a quantum dot material.

An embodiment of the present disclosure further provides a display apparatus, which includes the display panel described above.

BRIEF DESCRIPTION OF DRAWINGS

The accompanying drawings, which are included to provide a further understanding of the present disclosure and constitute a part of this specification, serve to explain the present disclosure together with the following detailed description, but do not constitute a limitation of the present disclosure. In the drawings.

DETAIL DESCRIPTION OF EMBODIMENTS

The embodiments of the present disclosure will be described in detail below with reference to the accompanying drawings. It should be understood that the embodiments described herein are only intended to illustrate and explain the present disclosure, but not to limit the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are some, but not all, embodiments of the present disclosure. All other embodiments, which can be derived by one of ordinary skill in the art from the described embodiments of the present disclosure without creative efforts, are within the protection scope of the present disclosure.

The term used herein to describe embodiments of the present disclosure is not intended to limit and/or define the scope of the present disclosure. For example, unless otherwise defined, a technical or scientific term used herein shall have the ordinary meaning as understood by one of ordinary skill in the art to which the present disclosure belongs. It should be understood that the terms "first", "second", and the like, as used in the present disclosure, do not denote any order, quantity, or importance, but rather are used to distinguish one element from another. The singular form "a", "an", or "the" or the like does not denote a limitation of quantity, but rather denotes the presence of at least one, unless the context clearly dictates otherwise. The word "comprising" or "comprises", or the like, means that the element or item appearing in front of the word "comprising" or "comprises" includes the element or item listed after the word "comprising" or "comprises" and its equivalents, and does not exclude other elements or items. The term "connected" or "coupled" or the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

In the following description, when an element or layer is referred to as being "on" or "connected to" another element or layer, it may be directly on, connected to, or intervening elements or layers may be present. However, when an element or layer is referred to as being "directly on" or "directly connected to" another element or layer, there are no intervening elements or layers present. The term "and/or" includes any and all combinations of one or more of the associated listed items.

Figure 1:
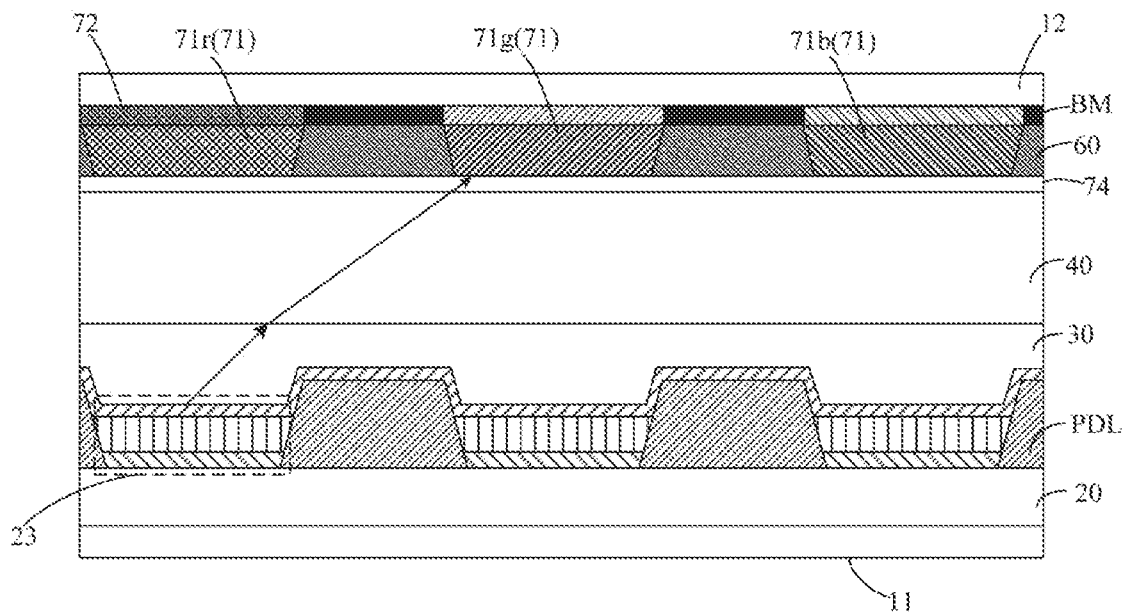
FIG. 1 is a schematic diagram of a display panel provided in related art.

FIG. 1 is a schematic diagram of a display panel provided in the related art. As shown in FIG. 1, the display panel may adopt a cell structure. Specifically, the display panel includes a display substrate and an opposite substrate, which are opposite to each other, and a filling layer 40 is arranged between the display substrate and the opposite substrate. The display substrate includes a first base substrate 11, and a driving structure layer 20, a pixel defining layer PDL, a plurality of light emitting devices 23, and a first encapsulation layer 30, which are arranged on the first base substrate 11. The pixel defining layer PDL has a plurality of pixel openings, each of which is provided with one light emitting device 23. The driving structure layer 20 is used to provide a driving current to each light emitting device 23 to drive the light emitting device 23 to emit light. The light emitting device 23 is used for emitting light of a preset color, such as blue light. The first encapsulation layer 30 covers the plurality of light emitting devices 23 for encapsulating the light emitting devices 23. The opposite substrate includes a second base substrate 12, and a color filter layer, a black matrix BM, a light exiting part group, and a second encapsulation layer 74, which are arranged on the second base substrate 12. The light exiting part group includes a plurality of light exiting parts 71, and the plurality of light exiting parts 71 include, for example, a plurality of red light exiting parts 71r, a plurality of green light exiting parts 71g, and a plurality of blue light exiting parts 71b. Each light exiting part 71 corresponds to one light emitting device 23, and different light exiting parts 71 correspond to different light emitting devices 23, respectively. The red light exiting part 71r emits red light under an excitation of the light of a preset color, the green light exiting part 71g emits green light under the excitation of the light of a preset color, and the blue light exiting part 71b directly transmits blue light. For example, the materials of the red light exiting part 71r and the green light exiting part 71g each include a quantum dot material. The material of the blue light exiting part 71b may include a scattering particle material. The color filter layer includes a plurality of color filter parts 72, which correspond to the light exiting parts 71 in a one-to-one correspondence. The color of the color filter part 72 is the same as the color of a corresponding light exiting part 71. The second encapsulation layer 74 is arranged on a side of the light exiting part group away from the second base substrate 12, and is used for encapsulating the light exiting part group.

When the display panel displays, light emitted by the light emitting device 23 is not completely collimated, but some light with a large angle is generated, so that some light emitted by the light emitting device 23 irradiates the light exiting part corresponding to an adjacent light emitting device 23. For example, as shown in FIG. 1, a part of light emitted by the light emitting device 23 corresponding to the red light exiting part 71r may irradiate the green light exiting part 71g, so as to excite the green light exiting part 71g to emit light, thereby causing a crosstalk problem between pixels.

Figure 2A:
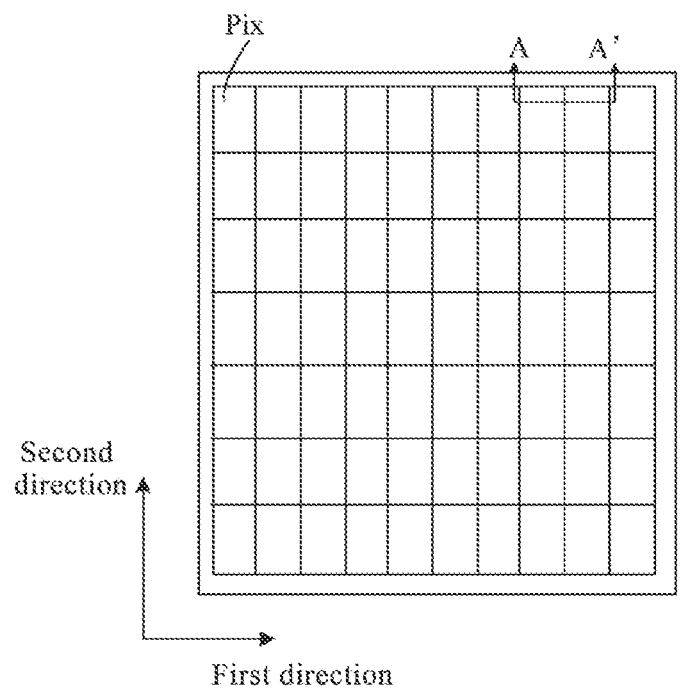
FIG. 2A is a plan view of a display panel provided in some embodiments of the present disclosure.
Figure 2B:
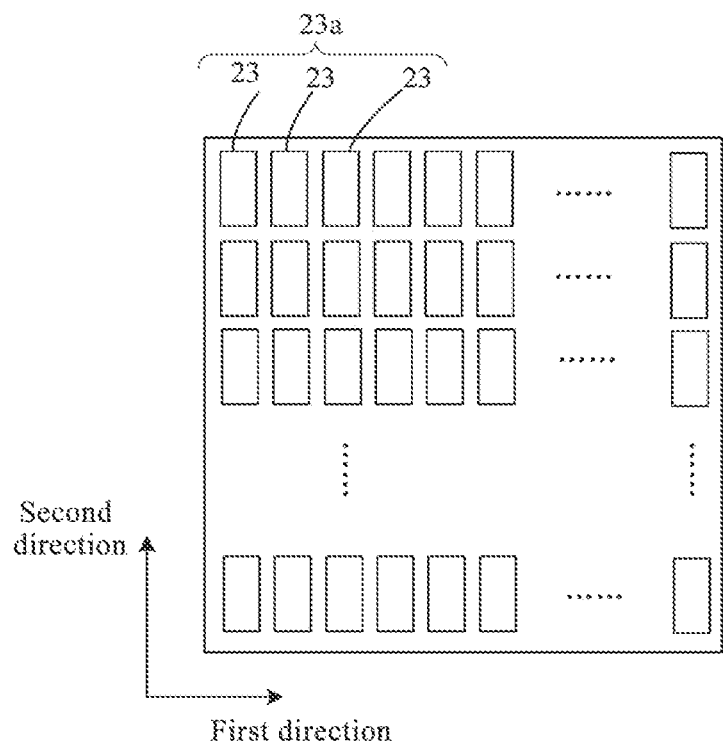
FIG. 2B is a schematic diagram illustrating a distribution of light emitting devices on a first base substrate provided in some embodiments of the present disclosure.
Figure 3:
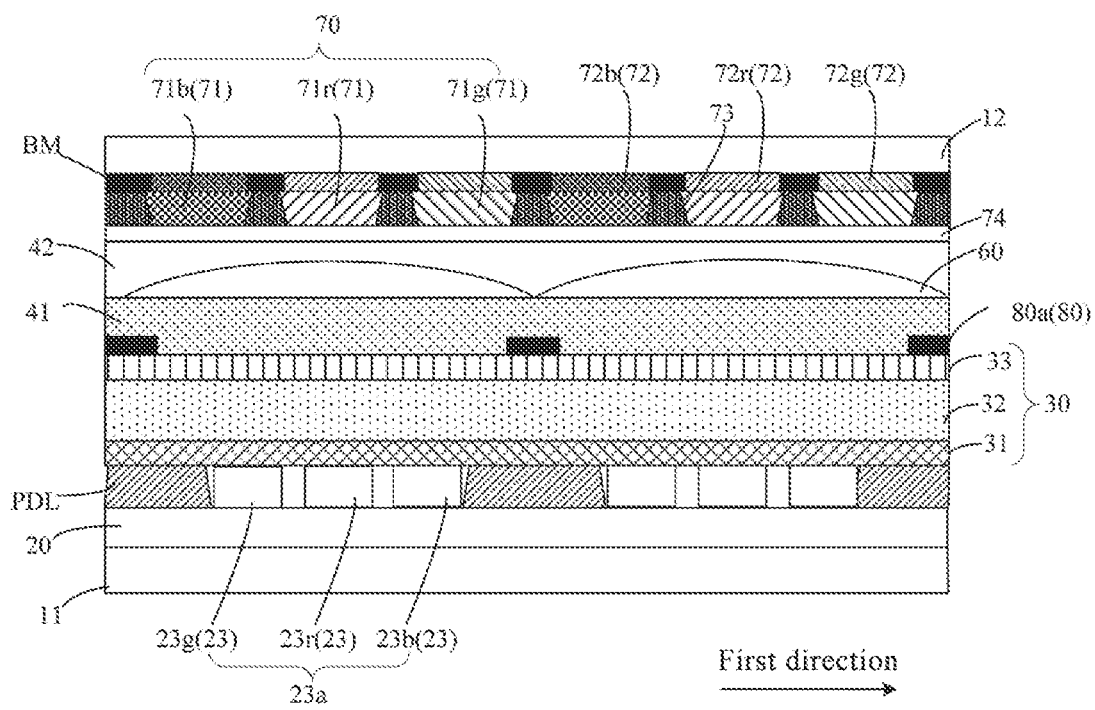
FIG. 3 is a sectional view taken along a line A-A' in FIG. 2A provided in some embodiments of the present disclosure.

FIG. 2A is a plan view of a display panel provided in some embodiments of the present disclosure, FIG. 2B is a schematic diagram illustrating a distribution of light emitting devices on a first base substrate provided in some embodiments of the present disclosure, and FIG. 3 is a sectional view taken along a line A-A' in FIG. 2A provided in some embodiments of the present disclosure. As shown in FIG. 2A, the display panel is divided into a plurality of sub-pixels Pix. For example, the plurality of sub-pixels Pix are arranged in an array and may constitute a plurality of pixel units, wherein each pixel unit includes a red sub-pixel, a green sub-pixel and a blue sub-pixel arranged in a first direction. It should be noted that the arrangement of the sub-pixels Pix in FIG. 2A is only an exemplary illustration, and other arrangements may alternatively be adopted. As shown in FIGS. 2A to 3, the display panel includes a first base substrate 11, a plurality of light emitting device groups, a plurality of light exiting part groups 70, and a plurality of optical structure units 60.

The first base substrate 11 may be a glass substrate, or may be a flexible substrate made of a flexible material such as Polyimide (PI), so as to facilitate a realization of flexible display.

The light emitting device groups 23a are arranged on the first base substrate 11, each pixel unit is provided with one light emitting device group 23a, each light emitting device group 23a includes a plurality of light emitting devices 23, and the light emitting devices 23 each are used to emit light of a preset color. The plurality of light emitting devices 23 in each light emitting device group 23a may include a first light emitting device 23r and a second light emitting device 23g. A driving structure layer 20 may further be arranged on the first base substrate 11, and the driving structure layer 20 is used to provide a driving signal to each light emitting device 23 to drive the light emitting device 23 to emit light.

The plurality of light exiting part groups 70 are arranged on a light emergence side of the light emitting device groups 23a, each light exiting part group 70 includes a plurality of light exiting parts 71, and the plurality of light exiting parts 71 in each light exiting part group 70 include a first color conversion part and a second color conversion part. The first color conversion part is used for converting the light of the preset color into light of a first color when receiving the light of the preset color. The second color conversion part is used for converting the light of the preset color into light of a second color when receiving the light of the preset color.

The plurality of optical structure units 60 are arranged between the plurality of light emitting device groups 23a and the plurality of light exiting part groups 70. An orthographic projection of each optical structure unit 60 on the first base substrate 11 covers an orthographic projection of at least one light emitting device group 23a on the first base substrate 11. Orthographic projections of different optical structure units 60 on the first base substrate do not overlap. Each optical structure unit 60 is configured to direct light emitted by the first light emitting device 23r to the first color conversion part, so that the first color conversion part converts the light of the preset color into the light of the first color, and to direct light emitted by the second light emitting device 23g to the second color conversion part, so that the second color conversion part converts the light of the preset color into the light of the second color.

Each optical structure unit 60 has at least one curved surface, for example, a surface of the optical structure unit 60 away from the first base substrate 11 is a curved surface. The curved surface of the optical structure unit 60 is a continuous smooth curved surface and does not have an inflection point. For example, the curved surface of the optical lens unit 60 is a convex arc surface.

In the embodiment of the present disclosure, the optical structure unit 60 is arranged between the light emitting device group 23a and the light exiting part group 70, the light emitted by the first light emitting device 23r in the light emitting device group 23a may irradiate the first color conversion part after passing through the optical structure unit 60, and the light emitted by the second light emitting device 23g may irradiate the second color conversion part after passing through the optical structure unit 60, so as to reduce or prevent crosstalk between incident light onto the first color conversion part and incident light onto the second color conversion part, thereby improving the display effect.

In some embodiments, wavelength ranges of the light of the first color and the light of the second color may be different from each other. For example, the light of the first color is red light, and the light of the second color is green light.

In some embodiments, an orthographic projection of the first light emitting device 23r on the first base substrate 11 does not overlap an orthographic projection of the first color conversion part on the first base substrate 11; and/or an orthographic projection of second light emitting device 23g on first base substrate 11 does not overlap an orthographic projection of the second color conversion part on first base substrate 11.

Figure 4A:
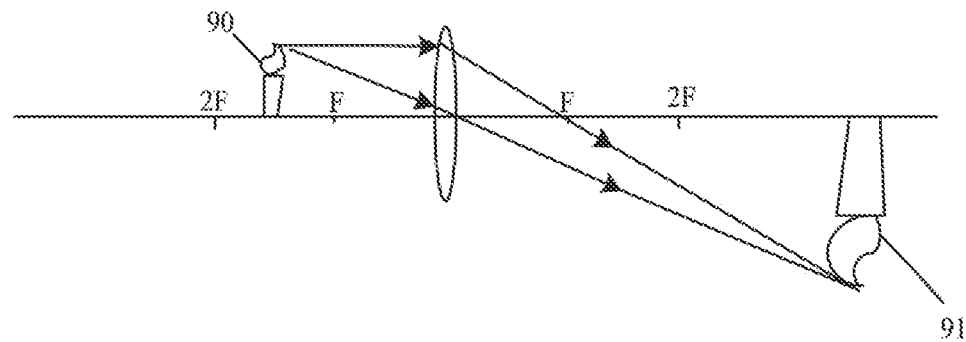
FIG. 4A is a schematic diagram illustrating a principle of lens imaging.

In some embodiments, the optical structure unit 60 adopts a condensing lens, such as a convex lens. FIG. 4A is a schematic diagram illustrating a principle of lens imaging. As shown in FIG. 4A, a mark F is a focal position of the convex lens 91, and a mark 2F is at twice a focal length of the convex lens 91. Where a light source 90 is located on one side of the convex lens 91 and between one and two times the focal length of the convex lens 91, an inverted image may be formed on the other side of the convex lens 91.

Figure 4B:
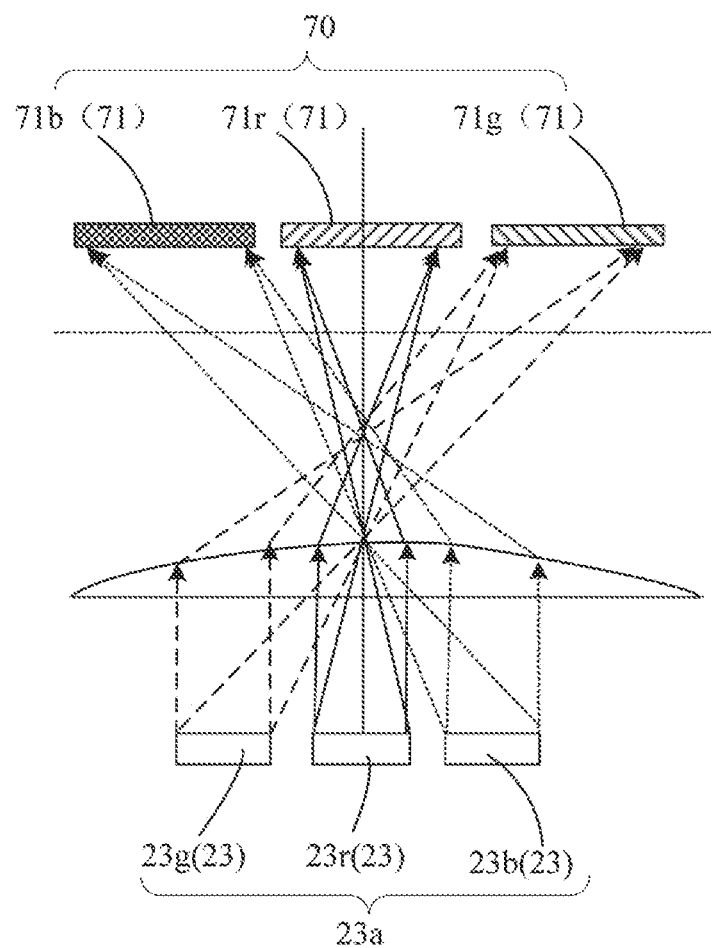
FIG. 4B is a schematic diagram illustrating how light emitted by the light emitting device group irradiates a plurality of light exiting parts provided in some embodiments of the present disclosure.

FIG. 4B is a schematic diagram illustrating how light emitted by the light emitting device group irradiates a plurality of light exiting parts provided in some embodiments of the present disclosure. As shown in FIG. 4B, for three light emitting devices 23 of the light emitting device group 23a, after the light emitted by a left light emitting device 23 passes through the optical structure unit 60, the light irradiates a right light exiting part 71; after the light emitted by a middle light emitting device 23 passes through the optical structure unit 60, the light irradiates a middle light exiting part 71; after the light emitted by a right light emitting device 23 passes through the optical structure unit 60, the light irradiates a left light exiting part 71.

The display panel in the embodiment of the present disclosure will be specifically described below by taking as an example that the plurality of light emitting devices 23 in the light emitting device group 23a are sequentially arranged in the first direction.

In some embodiments, as shown in FIG. 3, the driving structure layer 20 is arranged on the first base substrate 11, and the driving structure layer 20 includes a plurality of pixel driving circuits, the pixel driving circuits are in a one-to-one correspondence with the light emitting devices 23, and each of the pixel driving circuits is configured to provide a driving current for the light emitting device 23 to drive the light emitting device 23 to emit light. For example, the pixel drive circuit includes a plurality of thin film transistors 21.

Figure 5:
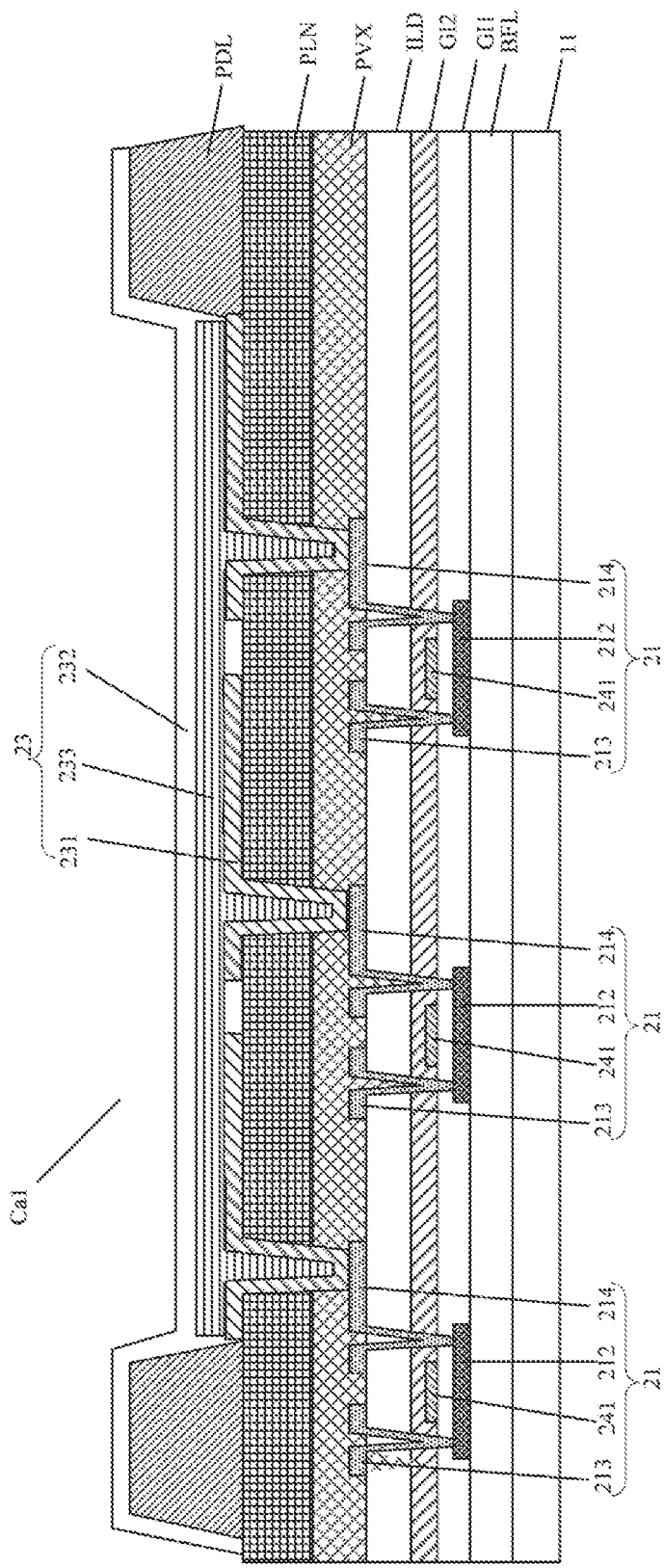
FIG. 5 is a schematic diagram illustrating a connection between a driving structure layer and a light emitting device provided in some embodiments of the present disclosure.

FIG. 5 is a schematic diagram illustrating a connection between a driving structure layer and a light emitting device provided in some embodiments of the present disclosure. As shown in FIG. 5, the thin film transistor 21 includes a gate electrode 211, an active layer 212, a source electrode 213 and a drain electrode 214. Taking a top gate thin film transistor as an example of the thin film transistor 21, the active layer 212 is located between the gate electrode 211 and the first base substrate 11. A material of the active layer 212 may include, for example, an inorganic semiconductor material (e.g., poly-silicon, amorphous silicon, etc.), an organic semiconductor material, or an oxide semiconductor material. The active layer 212 includes a channel part, and a source connecting part and a drain connecting part on both sides of the channel part, the source connecting part is connected to the source electrode 213 of the thin film transistor 21, and the drain connecting part is connected to the drain electrode 214 of the thin film transistor 21. Each of the source connecting part and the drain connecting part may be doped with an impurity (e.g., an N-type impurity or a P-type impurity) having a higher impurity concentration than the channel part. The channel part is directly opposite to the gate electrode 211 of the thin film transistor 21. When a voltage signal applied to the gate electrode 211 reaches a certain value, a carrier path is formed in the channel part, so that the source electrode 213 and the drain electrode 214 of the thin film transistor 21 are in conduction.

A buffer layer BFL is arranged between the thin film transistor 21 and the first base substrate 11 for preventing or reducing diffusion of metal atoms and/or impurities from the first base substrate 11 into the active layer 212 of the transistor. The buffer layer BFL may include an inorganic material such as silicon oxide, silicon nitride, and/or silicon oxynitride, and may be formed as a multi-layer or a single layer.

A first gate insulating layer GI1 is arranged on a side of the active layer 212 away from the first base substrate 11. A material of the first gate insulating layer GI1 may include a silicon compound or a metal oxide. For example, the material of the first gate insulating layer GI1 includes silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. In addition, the first gate insulating layer GI1 may be a single layer or a multi-layer.

A gate electrode layer is arranged on a side of the first gate insulating layer GI1 away from the first base substrate 11. The gate electrode layer includes a gate electrode 211 of each thin film transistor and a first electrode plate of a capacitor. A material of the gate electrode layer may include, for example, a metal alloy, a metal nitride, a conductive metal oxide, a transparent conductive material, or the like. For example, the gate electrode layer may include gold, an alloy of gold, silver, an alloy of silver, aluminum, an alloy of aluminum, aluminum nitride, tungsten, tungsten nitride, copper, an alloy of copper, nickel, chromium, chromium nitride, molybdenum, an alloy of molybdenum, titanium, titanium nitride, platinum, tantalum, tantalum nitride, neodymium, scandium, strontium ruthenium oxide, zinc oxide, tin oxide, indium oxide, gallium oxide, indium tin oxide, indium zinc oxide, or the like. The gate electrode layer may be a single layer or a multi-layer.

A second gate insulating layer GI2 is arranged on a side of the gate electrode layer away from the first base substrate 11, and a material of the second gate insulating layer GI2 may include, for example, a silicon compound or a metal oxide. For example, the material of the second gate insulating layer GI2 may include silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. The second gate insulating layer GI2 may be formed as a single layer or a multi-layer.

A second electrode plate (not shown) of the capacitor is arranged on a side of the second gate insulating layer GI2 away from the first base substrate 11, and a material of the second electrode plate may be the same as that of the first electrode plate, and the conductive materials listed above may be specifically referred to.

An interlayer insulating layer ILD is arranged on a side of the second electrode plate away from the first base substrate 11, a material of the interlayer insulating layer ILD may include, for example, a silicon compound, a metal oxide, etc.

In particular, the silicon compounds and metal oxides listed above may be selected and will not be repeated here.

A source/drain conductive layer is arranged on a side of the interlayer insulating layer ILD away from the first base substrate 11. The first source/drain conductive layer may include a source electrode 213 and a drain electrode 214 of a respective transistor, the source electrode 213 is electrically connected to the source connecting part, and the drain electrode 214 is electrically connected to the drain connecting part. The source/drain conductive layer may include a metal, an alloy, a metal nitride, a conductive metal oxide, a transparent conductive material, or the like, for example, the source/drain conductive layer may be made of a single layer of metal or a plurality of layers of metals, such as Mo/Al/Mo or Ti/Al/Ti.

A passivation layer PVX is arranged on a side of the source/drain conductive layer away from the first base substrate 11, and a material of the passivation layer PVX may include, for example, silicon oxynitride, silicon oxide, silicon nitride, or the like. A planarization layer PLN is arranged on a side of the passivation layer PVX away from the first base substrate 11. The planarization layer PLN may be made of an organic insulating material, for example, the organic insulating material may include a resin material such as polyimide, epoxy, acryl, polyester, photoresist, polyacrylate, polyamide, siloxane, or the like.

As shown in FIGS. 2 and 5, a pixel defining layer PDL is arranged on a side of the driving structure layer 20 away from the first base substrate 11. The pixel defining layer has a plurality of first accommodation grooves Ca1, the plurality of light emitting devices 23 in a same light emitting device group 23a are arranged in a same first accommodation groove Ca1, and different light emitting device groups 23a are arranged in different first accommodation grooves Ca1, respectively. The plurality of light emitting devices 23 in each light emitting device group 23a include a first light emitting device 23r, a second light emitting device 23g, and a third light emitting device 23b. As shown in FIG. 5, the light emitting device 23 includes a first electrode 231, a second electrode 232, and a light emitting layer 233 between the first electrode 231 and the second electrode 232. The first electrode 231 may be an anode, and the second electrode 232 may be a cathode. The first electrodes 231 of the plurality of light emitting devices 23 in a same first accommodation groove Ca1 are spaced apart from each other. The second electrodes 232 of the plurality of light emitting devices 23 may be formed as a one-piece structure.

In the embodiment of the present disclosure, arranging the plurality of light emitting devices 23 of a same light emitting device group 23a in a same first accommodation groove Ca1 is advantageous in reducing a distance between the light emitting devices 23, thereby is advantageous in reducing a size of the optical structure unit 60 in the first direction.

In the same first accommodation groove Ca1, an interval between the first electrodes 231 adjacent to each other may be about 1.5 μm, for example, in a range of 1.5 μm to 1.8 μm. The first electrode 231 may be formed using a sputtering process, in which a mask is placed between the first base substrate 11 and a sputtering source to form the plurality of first electrodes 231 with intervals in each first accommodation groove Ca1.

Figure 6:
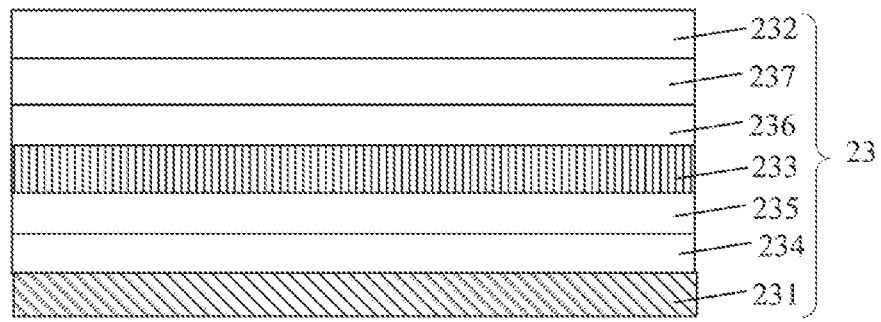
FIG. 6 is a schematic diagram illustrating a specific distribution of film layers of a light emitting device provided in some embodiments of the present disclosure.

It should be noted that the structure of the light emitting device 23 in FIG. 5 is only a schematic illustration, and the light emitting device 23 may further include other film layers. FIG. 6 is a schematic diagram illustrating a specific distribution of film layers of a light emitting device provided in some embodiments of the present disclosure. As shown in FIG. 6, the light emitting device 23 may further include, in addition to the light emitting layer 233, the first electrode 231, and the second electrode 232, a hole injection layer 234, a hole transport layer 235, an electron injection layer 237, and an electron transport layer 236. The hole injection layer 234 is located between the first electrode 231 and the light emitting layer 233, the hole transport layer 235 is located between the hole injection layer 234 and the light emitting layer 233, the electron injection layer 237 is located between the light emitting layer 233 and the second electrode 232, and the electron transport layer 236 is located between the electron injection layer 237 and the light emitting layer 233.

Alternatively, the light emitting device 23 is an OLED device, and in this case, the light emitting layer adopts an organic light emitting material. Alternatively, the light emitting device 23 is a QLED (Quantum Dot Light Emitting diode) device, and in this case, the light emitting layer adopts a quantum dot light emitting material. Each light emitting device 23 is configured to emit light of a preset color.

As shown in FIG. 3, the display panel further includes a first encapsulation layer 30, which covers the pixel defining layer PDL and the plurality of light emitting devices 23, and is used for encapsulating the light emitting devices 23 to prevent the light emitting devices 23 from being corroded by moisture and/or oxygen in the external environment. In some embodiments, the first encapsulation layer 30 includes a first encapsulation sub-layer 31, a second encapsulation sub-layer 32 and a third encapsulation sub-layer 33, which are sequentially arranged in a direction away from the first base substrate 11. The first encapsulation sub-layer 31 and the third encapsulation sub-layer 33 each may be made of an inorganic material with high compactness, such as silicon oxynitride, silicon oxide, or silicon nitride. The second encapsulation sub-layer 32 may be made of a polymer material containing a desiccant or a polymer material that can block moisture. For example, a polymer resin is used, so that a stress of the first encapsulation sub-layer 31 and the third encapsulation sub-layer 33 can be relieved, and a water-absorbing material such as a desiccant can be included to absorb water molecules and/or oxygen molecules that invade inside.

A first filling layer 41 is arranged on a side of the first encapsulation layer 30 away from the first base substrate 11. The first filling layer 41 may be made of a transparent organic material. A surface of the first filling layer 41 away from the first base substrate 11 is substantially flat, so as to facilitate the arrangement of the optical structure unit 60.

With continued reference to FIG. 3, the display panel further includes a second base substrate 12 and a plurality of light exiting part groups 70 arranged on the second base substrate 12. The second base substrate 12 is arranged opposite to the first base substrate 11, and the second base substrate 12 may be a glass substrate or a flexible substrate made of a flexible material such as Polyimide (PI), so as to facilitate the realization of flexible display. The light exiting part groups 70 are arranged on a side of the second base substrate 12 close to the first base substrate 11. The light exiting part group 70 includes a plurality of light exiting parts 71, and the light exiting parts 71 include a first color conversion part 71r, a second color conversion part 71g, and a light transmission part 71b. The first color conversion part 71r is used to convert the light of the preset color into light of a first color, for example, a red light, when receiving the light of the preset color. The second color conversion part 71g is used to convert the light of the preset color into light of a second color, such as green light, when receiving the light of the preset color. The light transmission part 71*b* transmits the light of the preset color emitted by the light emitting device 23.

Here, a material of each of the first color conversion part 71*r* and the second color conversion part 71*g* includes a quantum dot material. For example, the material of the first color conversion part 71*r* includes a red quantum dot material, the material of the second color conversion part 71*g* may include a green quantum dot material, and the material of the light transmission part 71*b* includes a scattering particle material. The red quantum dot material is used for emitting red light under excitation of blue light emitted by the light emitting device 23. The green quantum dot material is used to emit green light under excitation of blue light emitted by the light emitting device 23. The red quantum dot material and the green quantum dot material may be at least one of indium phosphide (InP), zinc oxide (ZnO), graphene, cadmium selenide (CdSe), cadmium sulfide (CdS), cadmium telluride (CdTe), zinc selenide (ZnSe), zinc telluride (ZnTe) or zinc sulfide (ZnS). A luminescent color of a quantum dot material may be controlled by controlling a particle size of the quantum dot material. For example, the red quantum dot material and the green quantum dot material are both zinc sulfide, and in this case, the particle size of the red quantum dot material is in a range of 9 nm to 10 nm, so that red light is emitted; and the particle size of the green quantum dot material is in a range of 6.5 nm to 7.5 nm, so that green light is emitted. The material of the light transmission part 71*b* includes a scattering particle material so as to scatter the received blue light.

The first color conversion part 71*r* and the second color conversion part 71*g* may be doped with scattering particles to increase an emergent angle of the light exiting part 71.

As shown in FIG. 3, the display panel further includes an accommodation structure 73, which has a plurality of second accommodation parts. Each of the second accommodation parts is provided with one light exiting part 71, and different light exiting parts 71 are provided in different second accommodation parts, respectively. That is, each of the first color conversion parts 71*r*, the second color conversion parts 71*g*, and the light transmission parts 71*b* is provided in one second accommodation part, different first color conversion parts 71*r* are provided in different second accommodation parts, respectively, different second color conversion parts 71*g* are provided in different second accommodation parts, respectively, different light transmission parts 71*b* are provided in different second accommodation parts, respectively, and the first color conversion part 71*r*, the second color conversion part 71*g*, and the light transmission part 71*b* are provided in second accommodation parts different from each other, respectively. A sectional area of each second accommodation part may gradually increase in a direction approaching the first base substrate 11.

A material of the accommodation structure 73 may include acrylic polymer photo-initiator, organic pigment, resin organic material, or a mixture thereof, wherein the organic pigment may be black to make the accommodation structure have a light shielding function and prevent crosstalk occurring between different light exiting parts 71.

In some embodiments, orthographic projections of the first color conversion part 71*r*, the second color conversion part 71*g*, the light transmission part 71*b*, and each light emitting device 23 on the first base substrate 11 are each within an orthographic projection of the optical structure unit 60 on the first base substrate 11.

As shown in FIG. 3, a plurality of optical structure units 60 are arranged on a side of the first filling layer 41 away from the first base substrate 11. An orthographic projection of each optical structure unit 60 on the first base substrate 11 covers an orthographic projection of at least one light emitting device group 23*a* on the first base substrate 11, and covers orthographic projections of the first color conversion part 71*r*, the second color conversion part 71*g*, and the light exiting part 71*b* on the first base substrate 11. The orthographic projections of the different optical structure units 60 on the first base substrate 11 do not overlap. Each optical structure unit 60 is used to direct light emitted by the first light emitting device 23*r* to the first color conversion part 71*r*, so that the first color conversion part 71*r* emits light of the first color, is used to direct light emitted by the second light emitting device 23*g* to the second color conversion part 71*g*, so that the second color conversion part 71*g* emits the light of the second color, and is further used to direct light emitted by the third light emitting device 23*b* to the light transmission part 71*b*, so that the light exiting part 71*b* transmits the light of the preset color.

In some embodiments, the optical structure unit 60 has a first surface facing the light emitting device group 23*a* and a second surface facing the plurality of light exiting part groups 70, wherein the first surface is a flat surface, the second surface is a convex curved surface.

In one example, the optical structure unit 60 is a lenticular lens, and an axis of the lenticular lens extends along a second direction, which intersects the first direction. For example, the first direction is perpendicular to the second direction. It should be understood that the optical structure unit 60 is a lenticular lens, which means that the condensing lens is a part of a cylinder, and a central axis of the cylinder is a corresponding axis of the lenticular lens. As shown in FIG. 2B, the light emitting devices 23 on the first base substrate 11 are arranged in a plurality of rows and columns, the first direction is a row direction, and the second direction is a column direction. In this case, the plurality of light emitting device groups 23*a* arranged in the second direction may correspond to a same lenticular lens. That is, an orthographic projection of each lenticular lens on the first base substrate 11 may cover orthographic projections of the plurality of light emitting device groups 23*a* arranged in the second direction on the first base substrate 11.

In another example, a top edge of a longitudinal section of the optical structure unit 60 in the first direction is in a convex arc shape, and a top edge of a longitudinal section of the optical structure unit 60 in the second direction is also in a convex arc shape. In this way, when the plurality of light emitting devices 23 in the light emitting device group 23*a* are arranged in the first direction, the optical structure unit 60 can direct the light emitted by the first light emitting device 23*r* to enter the first color conversion part 71*r*, the light emitted by the second light emitting device 23*g* to enter the second color conversion part 71*g*, and the light emitted by the third light emitting device 23*b* to enter the light transmission part 23*b*. Meanwhile, the optical construction unit 60 can further prevent crosstalk between light of the light emitting device groups 23*a* adjacent to each other in the second direction.

In addition, where the light emitting device group 23*a* includes an odd number of light emitting devices 23, if the light of the first color emitted by the first light emitting device 23*r* is red light, the first light emitting device 23*r* and the first color conversion part 71*r* both correspond to a middle position of the optical structure unit 60 in the first direction. In this case, an orthographic projection of the first light emitting device 23r on the first base substrate 11 overlaps an orthographic projection of the first color conversion part 71r on the first base substrate 11, an orthographic projection of the second light emitting device 23g on the first base substrate 11 does not overlap an orthographic projection of the second color conversion part 71g on the first base substrate 11, and an orthographic projection of the third light emitting device 23b on the first base substrate 11 does not overlap an orthographic projection of the light transmission part 71b on the first base substrate 11. For example, where the optical structure unit 60 is a lenticular lens, and an axis of the lenticular lens extends along the second direction, an orthographic projection of the corresponding axis of the lenticular lens on the first base substrate 11 passes through an orthographic projection of the first color conversion part 71r on the first base substrate 11, and may also pass through an orthographic projection of the first light emitting device 23r on the first base substrate 11. For example, the orthographic projection of the corresponding axis of the optical structure unit 60 on the first base substrate 11 passes through a center of the orthographic projection of the first color conversion part 71r on the first base substrate 11 and passes through a center of the orthographic projection of the first light emitting device 23r on the first base substrate 11. In addition, an orthographic projection of the corresponding axis of the optical structure unit 60 on the first base substrate 11 passes through an orthographic projection of the middle first light emitting device 23r on the first base substrate 11. In the light emitting device group 23a, the first light-emitting device 23r located in the middle has the highest light utilization rate, so that the first color conversion part 71r with lower light effect is placed at a position corresponding to the middle of the optical structure unit 60, thereby improving a brightness of the first color conversion part 71r and making the light exiting effects of the light exiting parts 71 with different colors more uniform.

With continued reference to FIG. 3, the display panel further includes a second encapsulation layer 74, which is arranged on a side of the light exiting part groups 70 away from the second base substrate 12, and is used for encapsulating the light exiting part groups 70. A material of the second encapsulation layer 74 may be any one of silicon nitride, silicon oxide, and silicon oxynitride.

In addition, since external ambient light also contains blue light, when the blue light in the external ambient light is emitted into the first color conversion part 71r and the second color conversion part 71g, the first color conversion part 71r and the second color conversion part 71g are excited to emit light, so that the display effect of the display panel is affected. In order to prevent the display of the display panel from being interfered by the external ambient light, in some embodiments, as shown in FIG. 3, the display panel further includes a color filter layer and a black matrix BM. The color filter layer is located on a side of the light exiting part groups 70 away from the first base substrate 11. The color filter layer includes a plurality of color filter parts 72, which correspond to the light exiting parts 71 in a one-to-one correspondence, and have a same color as the light emitted by the corresponding light exiting parts 71, respectively. For example, the color filter parts 72 include a plurality of first color filter parts 72r, a plurality of second color filter parts 72g, and a plurality of color filter parts 72g. The first color filter part 72r has a same color as the first color conversion part 71r and is used to transmit the light of the first color; the second color filter part 72g has a same color as the second color conversion part 71g and is used to transmit the light of the second color; the third color filter part 72b has a same color as the light transmission part 71b, and is used to transmit the light of the preset color. The black matrix BM is located between the accommodation structure 73 and the second base substrate 12, and is formed as a mesh structure to define the plurality of sub-pixels. An orthographic projection of at least a part of each light exiting part 71 on the first base substrate 11 does not overlap an orthographic projection of the black matrix BM on the first base substrate 11. In addition, an orthographic projection of the accommodation structure 73 on the first base substrate 11 and the orthographic projection of the black matrix BM on the first base substrate 11 may coincide or substantially coincide.

As shown in FIG. 3, the display panel may further include a second filling layer 42, which is located on a side of the second encapsulation layer 74 close to the first base substrate 11, and may be an optical adhesive layer. In a manufacturing process of the display panel, the driving structure layer 20, the pixel defining layer PDL, the light emitting device 23, the first encapsulation layer 30, the optical structure unit 60, and other structures may be manufactured firstly on the first base substrate 11 to obtain a display substrate; and the color filter layer, the plurality of light exiting parts 70 and other structures may be manufactured on the second base substrate 12 to obtain an opposite substrate. Then, the display substrate and the opposite substrate are arranged opposite to each other, and fixed together through the second filling layer 42. The first filling layer 41 and the second filling layer 42 are both in contact with the optical structure unit 60, and the surface of the optical structure unit 60 close to the second filling layer 42 is a convex curved surface. In addition, a refractive index of each of the first filling layer 41 and the second filling layer 42 is different from that of the optical structure unit 60.

Relevant parameters of the optical structure unit 60 are described below.

According to the principle of lens imaging shown in FIG. 3, where an equivalent air thickness between the emergent surface of the light emitting device 23 and the emergent surface of the optical structure unit 60 is less than one time of the focal length of the optical structure unit 60, the light emitted by the light emitting device 23 cannot be directed to the light exiting part after passing through the optical structure unit 60. where the equivalent air thickness between the emergent surface of the light emitting device 23 and the emergent surface of the optical structure unit 60 is greater than two times of the focal length of the optical structure unit 60, a reduced image is formed after the light emitted by the light emitting device 23 passes through the optical structure unit 60, which requires that the area of the light emitting device 23 is set to be great to enable the light emitted by the light emitting device 23 to be fully utilized. However, if the area of the light emitting device 23 is set to be great and the area of the light exiting part is set to be low, a distance between the light exiting parts 71 is increased, resulting in a granular sensation in the display screen.

Therefore, in the embodiment of the present disclosure, the equivalent air thickness between the emergent surface of the light emitting device 23 and the emergent surface of the optical structure unit 60 is set to be in a range of one to two times of the focal length of the optical structure unit 60, so as to ensure the display effect of the display panel.

It should be noted that, in the embodiments of the present disclosure, the emergent surface of a certain structure refers to a surface of the structure that emits light, and the light incident surface refers to a surface of the structure that receives light. The equivalent air thickness between the two surfaces means a thickness of an equivalent air layer after the medium between the two surfaces is equated to one air layer. Assuming that the medium between the two surfaces is a first medium, then an optical path of the light in the first medium is consistent with an optical path of the light in the equivalent air layer, that is, $n_{medium\ 1} \times d_{medium\ 1} = n_{air} \times d_{air\ layer}$, where $n_{medium\ 1}$ is a refractive index of the first medium, $d_{medium\ 1}$ is a thickness of the first medium, $n_{air\ layer}$ is a refractive index of air, and $n_{air}$ is a thickness of the equivalent air layer.

Figure 7:
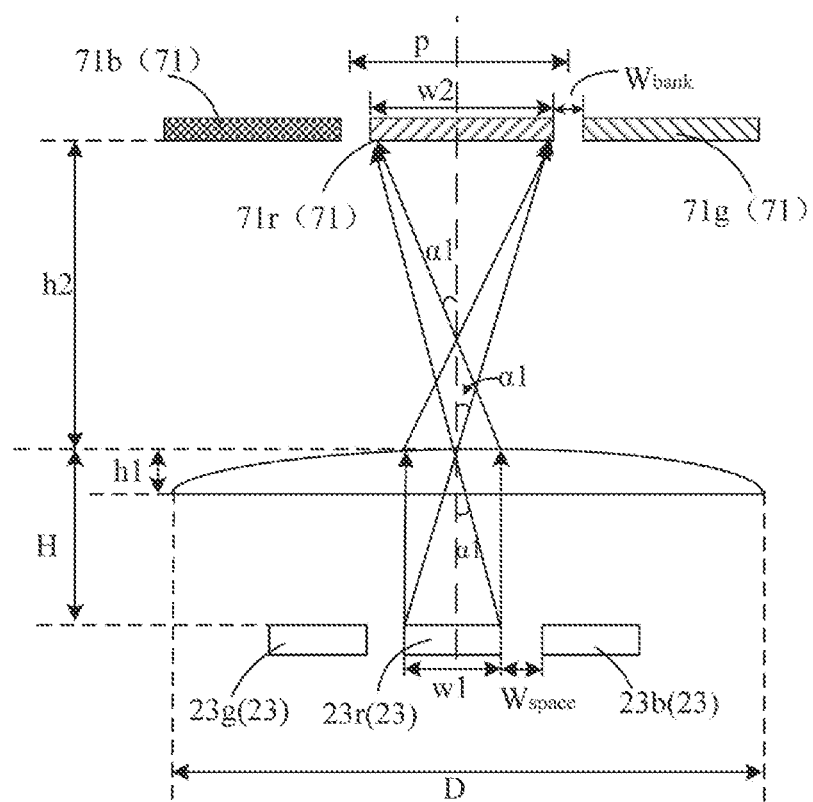
FIG. 7 is a schematic diagram illustrating dimensions of a part of structures provided in some embodiments of the present disclosure.

FIG. 7 is a schematic diagram illustrating dimensions of a part of structures provided in some embodiments of the present disclosure. As shown in FIG. 7, the optical structure unit 60 adopts a condensing lens, the sub-pixel has a width p, the refractive index of the optical structure unit 60 is $n_{lens}$, and the focal length of the optical structure unit 60 is f. In the manufacturing process of the display panel, the width of the sub-pixel may be determined according to the resolution required for an actual product. In addition, in the display panel, at least a dielectric layer such as an encapsulation layer is arranged between the optical structure unit 60 and the light emitting device 23. Where a thickness of the encapsulation layer is too low, the requirement of blocking water and oxygen cannot be met; where the thickness of the encapsulation layer is too great, the thickness of the display panel is great, therefore, the thickness range of the dielectric layer between the optical structure unit 60 and the light emitting device 23 needs to be determined by combining actual requirements. In addition, since a width of the equivalent air between the light emitting device 23 and the optical structure unit 60 needs to reach one to two times of the focal length f of the optical structure unit 60, the range of the focal length of the optical structure unit 60 can be determined according to the thickness range of the dielectric layer between the optical structure unit 60 and the light emitting device 23.

A relationship among the focal length f, the refractive index $n_{lens}$, a width D, and a curvature radius r of the optical construction unit 60, and the air refractive index n air satisfies the following formulas (1) and (2):

$$f = \frac{n_{lens} \times r}{n_{lens} - n_{air}} \quad (1)$$

$$r^2 - (r - h1)^2 = (D/2)^2 \quad (2)$$

The refractive index of the optical structure unit 60 may be determined according to a selectable material in the process, for example, the refractive index of the optical structure unit 60 is in a range of 1.5 to 2.0.

Where the equivalent air thickness between the emergent surface of the optical structure unit 60 and the emergent surface of the light emitting device 23 is a target thickness H, the collimated light emitted by a left end of the middle light emitting device 23 toward the optical structure unit 60 passes through the optical structure unit 60, and is refracted toward a right end of the middle light exiting part 71 (i.e., the red light exiting part 71r); the collimated light emitted by a right end of the middle light emitting device 23 toward the optical structure unit 60 passes through the optical structure unit 60, and is refracted toward a left end of the middle light exiting part 71. Assuming that a width of the emergent surface of the light emitting device 23 is w1, an arch height of the optical structure unit 60 is h1, a width of the light exiting part 71 is w2, the target distance is H, the equivalent air thickness between the emergent surface of the optical structure unit 60 and the light incident surface of the light exiting part 71 is H2, and the focal length of the optical structure unit 60 is f, the following relationships can be obtained according to the optical paths in FIG. 7:

$$\tan\alpha_1 = \frac{w1/2}{H} = \frac{w2/2}{h2},\ \tan\alpha_2 = \frac{w2/2}{h2 - f} = \frac{w1/2}{f},$$

Therefore, the target thickness H satisfies the following formula (3):

$$\frac{f - h1}{H} = \frac{h2 - f}{h2} \quad (3)$$

In order to prevent crosstalk from occurring between different sub-pixels, the equivalent air thickness between the emergent surface of the optical structure unit 60 and the emergent surface of the light emitting device 23 is greater than or equal to the target thickness H. Alternatively, the equivalent air thickness between the emergent surface of the optical structure unit 60 and the emergent surface of the light emitting device 23 is set as the target thickness H to reduce the overall thickness of the display panel.

It should be noted that the diagram of optical paths in FIG. 7 is simulated on the premise of an air medium. In an actual product, the dielectric layer between the optical structure unit 60 and the light emitting device 23 is not air, then, after determining the equivalent air thickness between the emergent surface of the light emitting device 23 and the emergent surface of the optical structure unit 60, the thickness of the dielectric layer between the emergent surface of the optical structure unit 60 and the emergent surface of the light emitting device 23 is determined according to the equivalent air thickness, the refractive index of air, and the refractive index of the dielectric layer between the emergent surface of the optical structure unit 60 and the emergent surface of the light emitting device 23. That is, a physical distance between the emergent surface of the optical structure unit 60 and the emergent surface of the light emitting device 23 in an actual product is determined, the physical distance is a distance between the highest point of the optical structure unit 60 and the emergent surface of the light emitting device 23.

From the diagram of optical paths in FIG. 7, it may be derived that: w2/w1=h2/H. Where w2 is approximated to D/3, the width D of the optical structure unit 60 and the width w1 of the emergent surface of the light emitting device 23 satisfy the following formula (4):

$$\frac{D/3}{w1} = \frac{h2}{H} \quad (4)$$

In addition, a width $W_{bank}$ of the accommodation structure 73 between two light exiting portions 71 arranged in the first direction and a distance $W_{space}$ between two first electrodes 231 adjacent to each other in a same first accommodation groove Ca1 satisfy the following formula (5):

$$\frac{W_{bank}}{W_{space}} = \frac{h2}{H} \quad (5)$$

When H2/H is determined, a minimum value that can be reached by $W_{space}$ or the minimum value that can be reached by $W_{bank}$ is determined according to the process conditions, another width can be determined according to formula (5) above. A width $W_{PDL}$ of the pixel defining layer PDL between the two light emitting device groups 23a adjacent to each other and arranged in the first direction satisfies $W_{PDL}$=D−3×w1−2×$W_{space}$.

Figure 8:
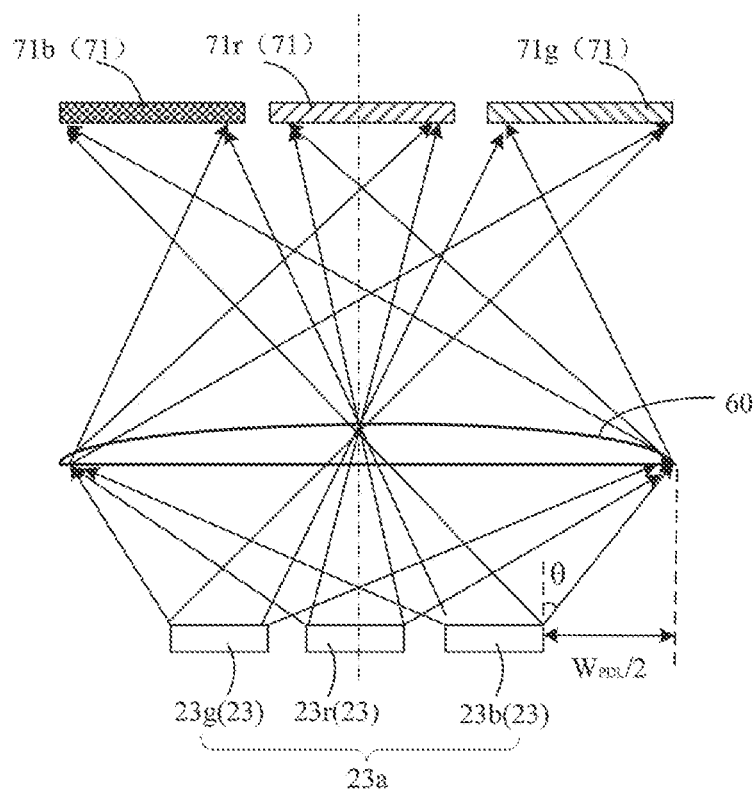
FIG. 8 is a schematic diagram of light of a respective light emitting device after being modulated by an optical structure unit provided in some embodiments of the present disclosure.

FIG. 8 is a schematic diagram of light of a respective light emitting device after being modulated by an optical structure unit provided in some embodiments of the present disclosure. As shown in FIG. 8, both ends of the optical structure unit 60 in the first direction exceed the light emitting device group, and a dimension of an excess portion in the first direction is $W_{PDL}$/2. A maximum emergent angle of the light emitting device 23 is θ, and the maximum emergent angle is a maximum angle that can be present between the light emitted by the light emitting device 23 and a thickness direction of the display panel.

Taking the rightmost light emitting device 23 in FIG. 8 as an example, where the following formula (6) is satisfied, the light of the maximum emergent angle emitted by the rightmost light emitting device 23 can irradiate the right end of the optical structure unit 60.

$$d_1*\sin\theta_1 + d_2*\sin\theta_2 + d_3*\sin\theta_3 + d_4*\sin\theta_4 = W_{PDL}/2 \quad (6)$$

$\theta_1$ is a maximum included angle between light incident into the first encapsulation sub-layer 31 and the thickness direction of the display panel, that is, an included angle between light propagating in the first encapsulation sub-layer 31 and the thickness direction of the display panel after the light with the maximum emergent angle emitted by the light emitting device 23 enters the first encapsulation sub-layer 31. $\theta_2$ is a maximum included angle between the light incident into the second encapsulation sub-layer 32 and the thickness direction of the display panel, that is, an included angle between the light propagating in the second encapsulation sub-layer 32 and the thickness direction of the display panel after the light of the maximum emergent angle emitted by the light emitting device 23 passes through the first encapsulation sub-layer 31 and enters the second encapsulation sub-layer 32. $\theta_3$ is a maximum included angle between the light incident into the third encapsulation sub-layer 33 and the thickness direction of the display panel, that is, an included angle between the light propagating in the third encapsulation sub-layer 33 and the thickness direction of the display panel after the light of the maximum emergent angle emitted by the light emitting device 23 passes through the first encapsulation sub-layer 31 and the second encapsulation sub-layer 32 and enters the third encapsulation sub-layer 33. $\theta_4$ is a maximum angle between the light incident into the first filling layer 41 and the thickness direction of the display panel, that is, an angle between the light propagating in the first filling layer 41 and the thickness direction of the display panel after the light of the maximum emergent angle emitted by the light emitting device 23 passes through the first encapsulation sub-layer 31, the second encapsulation sub-layer 32, and the third encapsulation sub-layer 33 and enters the first filling layer 41. $d_1$ is a thickness of the first encapsulation sub-layer 31, $d_2$ is a thickness of the second encapsulation sub-layer 32, $d_3$ is a thickness of the third encapsulation sub-layer 33, and $d_4$ is a thickness of the first filling layer 41.

$d_1$, $\sin\theta_1$, $d_2$, $\sin\theta_2$, $d_3$, $\sin\theta_3$, $d_4$ and $\sin\theta_4$ satisfy the following formula (7):

$$d_1*\sin\theta_1 = d_2*\sin\theta_2 = d_3*\sin\theta_3 = d_4*\sin\theta_4 \quad (7)$$

In order to prevent the light emitted by the light emitting device group 23a from reaching an adjacent optical structure unit 60, $\theta_1$, $\theta_2$, $\theta_3$, $\theta_4$, $d_1$, $d_2$, $d_3$, $d_4$ and $W_{PDL}$ may satisfy formula (7) and the following formula (8):

$$d_1*\sin\theta_1 + d_2*\sin\theta_2 + d_3*\sin\theta_3 + d_4*\sin\theta_4 \leq W_{PDL}/2 \quad (8)$$

Alternatively, the light emitted by the light emitting device group 23a can be prevented from reaching the adjacent optical structure unit 60 by other means. For example, as shown in FIG. 3, a light shielding layer 80 is arranged between the first filling layer 41 and the first encapsulation layer 30. An orthographic projection of the light shielding layer 80 on the first base substrate 11 is within an orthographic projection of the pixel defining layer PDL on the first base substrate 11, that is, the orthographic projection of the light shielding layer 80 on the first base substrate 11 is located in the orthographic projection of the pixel defining layer PDL on the first base substrate 11. The light shielding layer 80 may include a plurality of first light shielding strips 81 arranged along a first direction, and the first light shielding strips 81 extend along the second direction. A spacing region between every two light emitting device groups 23a adjacent to each other and arranged in the first direction corresponds to one first light shielding strip 81. In addition, the light shielding layer 80 may further include a plurality of second light shielding strips arranged in the second direction, each of the second light shielding strips extends in the first direction, and a spacing region between every two light emitting device groups 23a adjacent to each other and arranged in the second direction corresponds to one second light shielding strip.

In this case, a width $W_{SL}$ of the first light shielding strips 81 may satisfy the following formula (9) regardless of the formulas (7) and (8):

$$W_{SL} \geq W_{PDL} - (d_1*\sin\theta_1 + d_2*\sin\theta_2 + d_3*\sin\theta_3)*2 \quad (9)$$

It should be noted that in the above description, the "width" of each structure means the dimension of the structure in the first direction, unless otherwise specified.

In summary, when setting parameters of each structure in the display panel, the parameters of each structure are determined according to a first condition, a second condition, and a third condition, wherein the first condition is: the equivalent air thickness between the emergent surface of the light emitting device 23 and the emergent surface of the optical structure unit 60 is in a range of one to two times of the focal length of the optical structure unit 60; the second condition is formulas (1) to (5); and the third condition is formulas (7) to (8), and/or formula (9).

Parameter settings of each structure in the display panel is described in the following with reference to specific examples.

The resolution required for the display panel is 508 PPI, i.e., the width of the pixel unit is 50 μm and the width of the sub-pixel is 16.6 μm. For example, if the refractive index $n_{lens}$ of the optical structure unit 60 is 1.54, the width D of the optical structure unit 60 is 50 μm, and the arch height h1 is 25 μm, then, the curvature radius r is 25 μm, and the focal length f is 72 μm.

Where f=72 μm and H1=25 μm, the equivalent air thickness between the emergent surface of the light emitting device 23 and the emergent surface of the optical structure unit 60 is determined according to the first condition. For example, the equivalent air thickness is equal to the target thickness H and is 80 μm, and according to the formula (3), the equivalent air thickness between the emergent surface of the optical structure unit 60 and the light incident surface of the light emergent portion 71 is h2=174 μm, and w2/w1=2.2.

From formula (5), it may be derived that:

$$\frac{w_{bank}}{w_{space}} = \frac{h2}{H} = 2.2.$$

Assuming that the minimum value of Wspace available in the manufacturing process is 1.5 µm, then $W_{bank}$=3.3 µm.

The width of the light exiting part 71 is w2=P−$W_{bank}$=16.6−3.3=13.3 µm.

The width w1 of the emergent surface of the light emitting device 23 is w1=w2/2.2=6.0 µm.

The width $W_{PDL}$ of the pixel defining layer PDL between two light emitting device groups 23a adjacent to each other and arranged in the first direction is $W_{PDL}$=D−3×w1−2×$W_{space}$=50−3×6.0−2×1.5=24 µm.

The thickness and the refractive index of the first encapsulation sub-layer 31, the thickness and the refractive index of the second encapsulation sub-layer 32, the thickness and the refractive index of the third encapsulation sub-layer 33, and the thickness and the refractive index of the first filling layer 41 are adjusted, so that the equivalent air thickness between the emergent surface of the light emitting device 23 and the emergent surface of the optical structure unit 60 is 80 µm. After being adjusted, the refractive index, the thickness and the equivalent air thickness of each encapsulation sub-layer are as shown in table 1.

|  | Thickness (µm) | Refractive index | Equivalent air thickness (µm) |
|---|---|---|---|
| First encapsulation sub-layer | 1 | 1.9 | 2 |
| Second encapsulation sub-layer | 10 | 1.5 | 15 |
| Third encapsulation sub-layer | 0.6 | 2 | 1 |
| First filling layer | 15.3 | 1.52 | 23 |
| Optical structure unit | 25 | 1.54 | 39 |
| Equivalent air thickness between the emergent surface of the optical structure unit and the emergent surface of the light emitting device 23 |  |  | 80 |

In addition, assuming that the maximum angle $\theta_1$ between the light emitted by the light emitting device 23 incident into the first encapsulation sub-layer 31 and the display panel is 20°, then, $W_{SL} \geq 13.3$ µm may be obtained according to formula (9). For example, $W_{SL}$ may be set to 13.3 µm.

In the above-described embodiment, the crosstalk of light between pixel units is prevented by providing the light shielding layer 80 and by adjusting the width of the pixel defining layer PDL. In other embodiments of the present disclosure, crosstalk between sub-pixels can be further prevented by adjusting the thickness of each film layer in the light emitting device 23.

Specifically, in the light emitting device 23, the first electrode 231 is a reflective electrode, and for example, a metal material layer or a stack of a metal material layer and a transparent material layer such as Indium Tin Oxide (ITO) is used as the first electrode 231. The second electrode 232 is a transflective electrode, and a metal material layer with a small thickness may be used as the second electrode 232. A microcavity structure is formed between the first electrode 231 and the second electrode 232, and the microcavity structure is used for adjusting an intensity of emergent light of the light emitting device 23, so that the intensity of emergent light with an emergent angle exceeding 50° is less than the intensity of emergent light with an emergent angle in a range of 0° to 30°. The emergent angle refers to an included angle between the emergent direction and the thickness direction of the display panel.

In some embodiments, the intensity of the emergent light having an emergent angle exceeding 50° is less than 0.3 times the intensity of the collimated emergent light, i.e. emergent light having an emergent angle of 0°.

An emergent peak of the light emitting device 23=a transmission peak of the microcavity structure×an intrinsic luminescence peak of the light emitting device 23. In some embodiments, the thickness of the first electrode 231 is in a range of 90 nm to 110 nm; the thickness of the hole injection layer 234 is in a range of 70 nm to 80 nm; the thickness of the hole transport layer 235 is in a range of 40 nm to 50 nm, the thickness of the light emitting layer 233 is in a range of 45 nm to 55 nm; the thickness of the electron transport layer 236 is in a range of 190 nm to 210 nm; the thickness of the electron injection layer 237 is in a range of 210 nm to 230 nm; and the thickness of the second electrode 232 is in a range of 20 nm to 30 nm. In this case, for the emergent light with an emergent angle in a range of 0° to 30°, the transmission peak of the microcavity structure substantially coincides with the intrinsic peak of the light emitting device 23, so that the light can be emergent; for the emergent light with a large angle, the transmission peak of the microcavity structure is blue-shifted and does not coincide with the intrinsic peak of the light emitting device 23, so that the intensity of the emergent light with a large angle is weakened.

Figure 9:
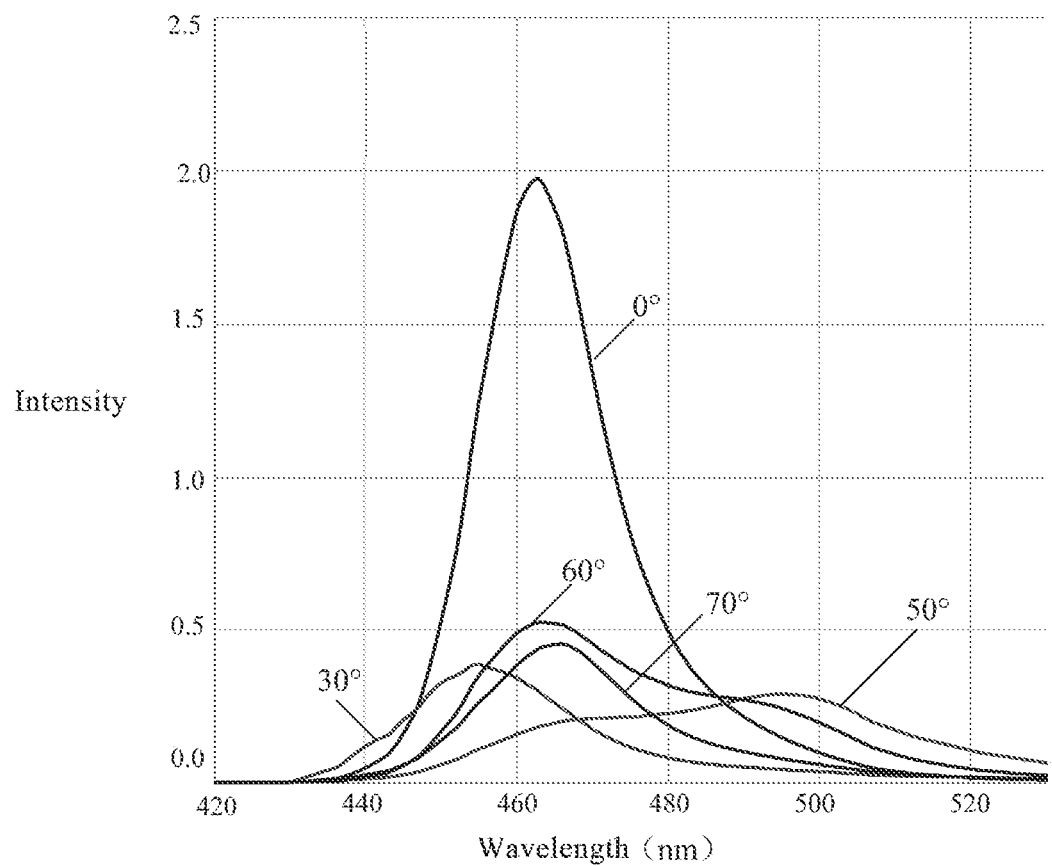
FIG. 9 is a spectrum diagram of a light emitting device at a respective emergent angle provided in a comparative example.
Figure 10:
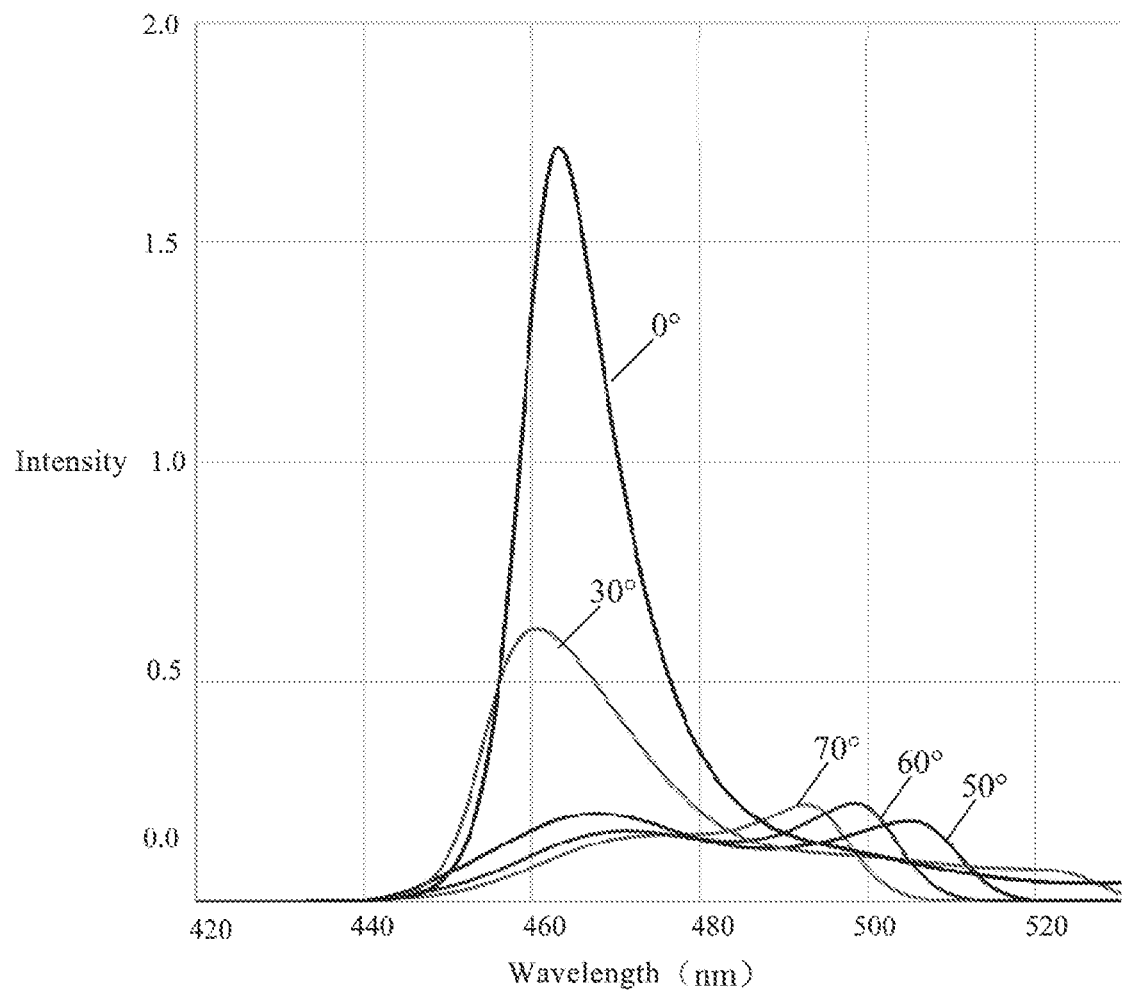
FIG. 10 is a spectrum diagram of a light emitting device at a respective emergent angle provided in one example of the present disclosure.

FIG. 9 is a spectrum diagram of a light emitting device at a respective emergent angle provided in a comparative example, and FIG. 10 is a spectrum diagram of a light emitting device at a respective emergent angle provided in one example of the present disclosure. In the comparative example, the material of the first electrode 231 is a laminate of silver and ITO, having a thickness of 180 nm, the thickness of the hole injection layer is 105 nm, the thickness of the hole transport layer is 60 nm, the thickness of the light emitting layer is 50 nm, the thickness of the electron transport layer is 160 nm, and the thickness of the electron injection layer is 140 nm; the material of the second electrode 232 includes magnesium and silver, and the thickness of the second electrode 232 is 25 nm. In one example of the present disclosure, the material of the first electrode 231 is a laminate of silver and ITO, the thickness of the first electrode 231 is 100 nm, the thickness of the hole injection layer 234 is 75 nm, the thickness of the hole transport layer 235 is 45 nm, the thickness of the light emitting layer 233 is 50 nm, the thickness of the electron transport layer 236 is 200 nm, the thickness of the electron injection layer 237 is 220 nm, the material of the second electrode 232 includes magnesium and silver, and the thickness of the second electrode 232 is 25 nm. As can be seen by comparing FIG. 9 with FIG. 10, in the embodiment of the present disclosure, for the blue light with the emergent angle in a range of 0° to 30°, the intensity is great; whereas for blue light with an emergent angle above 50°, the intensity is reduced. Therefore, the intensity of emergent light with large angle can be reduced by adjusting the thickness of each film layer, thereby further improving the crosstalk phenomenon between sub-pixels.

An embodiment of the present disclosure further provides a display apparatus, which includes the display panel in the above described embodiment. The display apparatus may be any product or component with a display function, such as a mobile phone, a tablet computer, a television, a monitor, a notebook computer, a digital photo frame, a navigator or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A display panel, comprising a plurality of light emitting device groups, a plurality of light exiting part groups and a plurality of optical structure units,
   wherein the plurality of light emitting device groups are on a first base substrate, each of the plurality of light emitting device groups comprises a plurality of light emitting devices, the plurality of light emitting devices comprise a first light emitting device and a second light emitting device, and the first light emitting device and the second light emitting device each are configured to emit light of a preset color;
   the plurality of light exiting part groups are on an emergent side of the light emitting device groups, and each of the plurality of light exiting part groups comprises a first color conversion part and a second color conversion part; and
   the plurality of optical structure units are between the plurality of light emitting device groups and the plurality of light exiting part groups, an orthographic projection of each of the plurality of optical structure units on the first base substrate covers an orthographic projection of at least one of the plurality of light emitting device groups on the first base substrate, each of the plurality of optical structure units is configured to direct light emitted by the first light emitting device to the first color conversion part and direct light emitted by the second light emitting device to the second color conversion part, the first color conversion part is configured to convert the light of the preset color into light of a first color, and the second color conversion part is configured to convert the light of the preset color into light of a second color,
   wherein an orthographic projection of the first light emitting device does not overlap an orthographic projection of the first color conversion part on the first base substrate; and/or
   an orthographic projection of the second light emitting device does not overlap an orthographic projection of the second color conversion part on the first base substrate.

2. The display panel according to claim 1, wherein the light of the first color is different from the light of the second color in wavelength range.

3. The display panel according to claim 1, wherein the plurality of light emitting devices in the light emitting device group further comprise a third light emitting device, each of the plurality of light exiting part groups further comprises a light transmission part, the orthographic projection of each of the plurality of optical structural units on the first base substrate further covers an orthographic projection of the third light emitting device on the first base substrate, and
   each of the plurality of optical structure units is further configured to direct light emitted by the third light emitting device to the light transmission part.

4. The display panel according to claim 1, wherein the optical structure unit is a condensing lens, and an equivalent air thickness between an emergent surface of the light emitting device and an emergent surface of the optical structure unit is in a range of one to two times a focal length of the condensing lens.

5. The display panel according to claim 4, wherein the equivalent air thickness between the emergent surface of the optical structure unit and the emergent surface of the light emitting device is greater than or equal to a target thickness, and the target thickness H satisfies the following formula:

$$\frac{f - h1}{H} = \frac{h2 - f}{h2},$$

where h1 is an arc height of the condensing lens, h2 is an equivalent air thickness between the emergent surface of the condensing lens and an incident surface of the light exiting part, and f is a focal length of the condensing lens.

6. The display panel according to claim 1, wherein the light emitting device comprises a first electrode and a light emitting layer on a side of the first electrode away from the first base substrate, and
   the display panel further comprises a pixel defining layer on the first base substrate, the pixel defining layer has a plurality of first accommodation grooves, the plurality of light emitting devices in a same light emitting device group are in a same first accommodation groove, different light emitting device groups are in different first accommodation grooves, respectively, and the first electrodes of the plurality of light emitting devices in the same first accommodation groove are spaced apart from each other.

7. The display panel according to claim 1, wherein the display panel further comprises:
   an encapsulation layer, which is on a side of the plurality of light emitting device groups away from the first base substrate, and is configured to encapsulate the plurality of light emitting device groups;
   a first filling layer on a side of the encapsulation layer away from the first base substrate; and
   a second filling layer between the first filling layer and the plurality of light exiting part groups,
   wherein the optical structure unit is between the first filling layer and the second filling layer and is in contact with the first filling layer and the second filling layer, and a surface of the optical structure unit close to the second filling layer is a convex curved surface; and
   a refractive index of the first filling layer and a refractive index of the second filling layer are different from a refractive index of the optical structure unit.

8. The display panel according to claim 7, wherein the display panel further comprises a pixel defining layer between the encapsulation layer and the first base substrate, any two light emitting device groups adjacent to each other are separated from each other by the pixel defining layer,
   the encapsulation layer comprises a first encapsulation sub-layer, a second encapsulation sub-layer and a third encapsulation sub-layer, which are sequentially arranged in a direction away from the first base substrate,
   wherein the plurality of light emitting devices in a same light emitting device group are arranged in a first direction, and a width $W_{PDL}$ of the pixel defining layer between the two light emitting device groups adjacent to each other and arranged in the first direction satisfies:

$$d_1 * \sin \theta_1 + d_2 * \sin \theta_2 + d_3 * \sin \theta_3 + d_4 * \sin \theta_4 \leq W_{PDL}/2,$$

where $\theta_1$ is a maximum included angle between light incident into the first encapsulation sub-layer and a thickness direction of the display panel, $\theta_2$ is a maximum included angle between light incident into the second encapsulation sub-layer and the thickness direction of the display panel, $\theta_3$ is a maximum included angle between light incident into the third encapsulation sub-layer and the thickness direction of the display panel, $\theta_4$ is a maximum included angle between light incident into the first filling layer and the thickness direction of the display panel; $d_1$ is a thickness of the first encapsulation sub-layer, $d_2$ is a thickness of the second encapsulation sub-layer, $d_3$ is a thickness of the third encapsulation sub-layer, and $d_4$ is a thickness of the first filling layer.

9. The display panel according to claim 7, wherein the display panel further comprises:
a pixel defining layer between the encapsulation layer and the first base substrate, wherein any two light emitting device groups adjacent to each other are spaced apart from each other by the pixel defining layer, and
a light shielding layer between the encapsulation layer and the first filling layer, wherein an orthographic projection of the light shielding layer on the first base substrate is within an orthographic projection of the pixel defining layer on the first base substrate.

10. The display panel according to claim 9, wherein the plurality of light emitting devices in the light emitting device group are sequentially arranged in a first direction, the light shielding layer comprises a plurality of first light shielding strips arranged in the first direction, each of the first light shielding strips extends in a second direction, and a spacing region between every two light emitting device groups adjacent to each other and arranged in the first direction corresponds to one of the plurality of first light shielding strips.

11. The display panel according to claim 10, wherein the encapsulation layer comprises a first encapsulation sub-layer, a second encapsulation sub-layer and a third encapsulation sub-layer, which are sequentially arranged in a direction away from the first base substrate, a width $W_{SL}$ of the first light shielding strip satisfies:

$$W_{SL} \geq W_{PDL} - (d_1 \times \sin\theta_1 + d_2 \times \sin\theta_2 + d_3 \times \sin\theta_3) \times 2,$$

where $\theta_1$ is a maximum included angle between light incident into the first encapsulation sub-layer and the thickness direction of the display panel, $\theta_2$ is a maximum included angle between light incident into the second encapsulation sub-layer and the thickness direction of the display panel, $\theta_3$ is a maximum included angle between light incident into the third encapsulation sub-layer and the thickness direction of the display panel, $W_{PDL}$ is a width of the pixel defining layer, $d_1$ is a thickness of the first encapsulation sub-layer, $d_2$ is a thickness of the second encapsulation sub-layer, and $d_3$ is a thickness of the third encapsulation sub-layer.

12. The display panel according to claim 1, wherein an orthographic projection of each of the plurality of light exiting part groups on the first base substrate is within the orthographic projection of the optical structure unit on the first base substrate.

13. The display panel according to claim 1, wherein the light emitting device comprises a first electrode, a second electrode and a light emitting layer, wherein the first electrode is on a side of the light emitting layer close to the first base substrate, the second electrode is on a side of the light emitting layer away from the first base substrate, the first electrode is a reflective electrode, the second electrode is a transflective electrode, a microcavity structure is formed between the first electrode and the second electrode, and the microcavity structure is configured to adjust an intensity of emergent light of the light emitting device, so that an intensity of emergent light with an emergent angle exceeding 50° is less than an intensity of emergent light with an emergent angle in a range of 0° to 30°.

14. The display panel according to claim 13, wherein the light emitting device further comprises a hole injection layer, a hole transport layer, an electron injection layer, and an electron transport layer, the hole injection layer is between the first electrode and the light emitting layer, the hole transport layer is between the hole injection layer and the light emitting layer, the electron transport layer is between the light emitting layer and the second electrode, the electron injection layer is between the electron transport layer and the electron injection layer, and
a thickness of the first electrode is in a range of 90 nm to 110 nm;
a thickness of the hole injection layer is in a range of 70 nm to 80 nm;
a thickness of the hole transport layer is in a range of 40 nm to 50 nm;
a thickness of the light emitting layer is in a range of 45 nm to 55 nm;
a thickness of the electron transport layer is in a range of 190 nm to 210 nm;
a thickness of the electron injection layer is in a range of 210 nm to 230 nm; and
a thickness of the second electrode is in a range of 20 nm to 30 nm.

15. The display panel according to claim 1, wherein the display panel further comprises an accommodation structure having a plurality of second accommodation grooves, each of the first color conversion parts and the second color conversion parts is in one of the plurality of second accommodation grooves, different first color conversion parts are in different ones of the plurality of second accommodation grooves, respectively, different second color conversion parts are in different ones of the plurality of second accommodation grooves, respectively, and the first color conversion part and the second color conversion part are in different ones of the second accommodation grooves, respectively.

16. The display panel according to claim 1, wherein the display panel further comprises:
a color filter layer on a side of the plurality of light exiting part groups away from the first base substrate, wherein the color filter layer comprises a plurality of first color filter parts and a plurality of second color filter parts, the first color filter parts correspond to the first color conversion parts in a one-to-one correspondence, the second color filter parts correspond to the second color conversion parts in a one-to-one correspondence, the first color filter part is configured to allow the light of the first color to pass through, and the second color filter part is configured to allow the light of the second color to pass through;
a black matrix on a side of the plurality of light exiting part groups away from the first base substrate, wherein an orthographic projection of at least a part of each of the first color conversion parts on the first base substrate, an orthographic projection of at least a part of each of the second color conversion parts on the first base substrate, and an orthographic projection of the black matrix on the first base substrate do not overlap; and a second base substrate on a side of the color filter layer away from the first base substrate.

17. The display panel according to claim 1, wherein the optical structure unit is a condensing lens.

18. The display panel according to claim 17, wherein the plurality of light emitting devices in a same light emitting device group are arranged in a first direction, the condensing lens is a lenticular lens, and an axis of the lenticular lens extends in a second direction which intersects the first direction; and the light of the first color is red light, and an orthographic projection of a corresponding axis of the condensing lens on the first base substrate passes through an orthographic projection of the first color conversion part on the first base substrate.

19. A display apparatus, comprising the display panel according to claim 1.

* * * * *